(12) United States Patent
Jacobsen et al.

(10) Patent No.: US 6,281,038 B1
(45) Date of Patent: Aug. 28, 2001

(54) METHODS FOR FORMING ASSEMBLIES

(75) Inventors: Jeffrey Jay Jacobsen, Hollister; Mark A. Hadley, Newark; Gordon S. W. Craig, Palo Alto, all of CA (US)

(73) Assignee: Alien Technology Corporation, Morgan Hill, CA (US)

( * ) Notice: Subject to any disclaimer, the term of this patent is extended or adjusted under 35 U.S.C. 154(b) by 0 days.

(21) Appl. No.: 09/270,165

(22) Filed: Mar. 16, 1999

Related U.S. Application Data

(60) Provisional application No. 60/118,887, filed on Feb. 5, 1999.

(51) Int. Cl.⁷ .................................................... H01L 21/44
(52) U.S. Cl. ........................ 438/106; 156/665.1; 438/107
(58) Field of Search ..................................... 438/106, 107, 438/110, 455, 457, 480; 29/453; 156/665.1

(56) References Cited

U.S. PATENT DOCUMENTS 5,155,895 * 10/1992 Jakiela et al. ............................ 29/453
5,824,186 * 10/1998 Smith et al. ........................... 438/455

* cited by examiner

*Primary Examiner*—David Nelms
*Assistant Examiner*—Dung Le
(74) *Attorney, Agent, or Firm*—Blakely, Sokoloff, Taylor & Zafman

(57) ABSTRACT

Methods and devices are claimed wherein blocks with integrated circuits thereon are rolled or pressed into recessed regions of a flexible or rigid substrate which is used in forming displays. Rolling the blocks into the substrate may take place in either a batch operation or in a continuous process.

13 Claims, 15 Drawing Sheets

METHODS FOR FORMING ASSEMBLIES

This application claims the benefit of the earlier filing date of co-pending provisional application of Jeffrey Jay Jacobsen entitled, "Apparatuses and Methods for Forming Assemblies," Ser. No. 60/118,887, filed Feb. 5, 1999 and incorporated herein by reference.

BACKGROUND INFORMATION

1. Field of the Invention

The present invention relates generally to the field of fabricating display panels. More particularly, the present invention relates to methods and devices for rolling or pressing blocks with integrated circuits thereon into recessed regions of a substrate used to form a display.

2. Description of Related Art

Fabrication of display panels is well known in the art. Display panels may be comprised of active matrix or passive matrix panels. Active matrix panels and passive matrix panels may be either transmissive or reflective. Transmissive displays include amorphous silicon, polysilicon thin-film transistor (TFT) displays, and high-resolution polysilicon displays. Reflective displays typically comprise single crystal silicon integrated circuit substrates that have reflective pixels.

Liquid crystals, electroluminescent (EL) materials, organic light emitting diodes (OLEDs), up and downconverting phosphor (U/DCP), electrophoretic (EP) materials, or light emitting diodes (LEDs) may be used in fabricating flat-panel display panels. Each of these is known in the art and is discussed briefly below.

Liquid crystal displays (LCDs) can have an active matrix backplane in which thin-film transistors are co-located with LCD pixels. Flat-panel displays employing LCDs generally include five different components or layers: a White or sequential Red, Green, Blue light source, a first polarizing filter, that is mounted on one side of a circuit panel on which the TFTs are arrayed to form pixels, a filter plate containing at least three primary colors arranged into pixels, and a second polarizing filter. A volume between the circuit panel and the filter plate is filled with a liquid crystal material. This material will rotate the polarized light when an electric field is applied between the circuit panel and a transparent ground electrode affixed to the filter plate or a cover glass. Thus, when a particular pixel of the display is turned on, the liquid crystal material rotates polarized light being transmitted through the material so that it will pass through the second polarizing filter. Some liquid crystal materials, however, require no polarizers. LCDs may also have a passive matrix backplane which is usually two planes of strip electrodes which sandwich the liquid crystal material. However, passive matrices generally provide a lower quality display compared to active matrices. Liquid crystal material includes, but is not limited to, twisted nematic (TN), Super TN, double STN, and ferroelectric. U/DCP and EP displays are formed in a similar fashion except the active medium is different (e.g., upconverting gas, downconverting gas, electrophoretic materials).

EL displays have one or more pixels that are energized by an alternating current (AC) that must be provided to each pixel by row and column interconnects. EL displays generally provide a low brightness output because passive circuitry for exciting pixel phosphors typically operates at a pixel excitation frequency that is low relative to the luminance decay time of the phosphor material. However, an active matrix reduces the interconnect capacitance allowing the use of high frequency AC in order to obtain more efficient electroluminescence in the pixel phosphor. This results in increased brightness in the display.

LED displays are also used in flat-panel displays. LEDs emit light when energized. OLEDs operate like the LEDs except OLEDs use organic material in the formation of the diode.

Regardless of the type of active medium used, displays are generally comprised of at least a substrate and a backplane. The backplane forms the electrical interconnection of the display and comprises electrodes, capacitors, and transistors in at least some embodiments of a backplane.

FIG. 1A illustrates a rigid display device wherein the active matrix display backplane 10 is coupled to a rigid substrate 12. Typically, the active matrix display backplane is also rigid. FIG. 1B shows another rigid display. There, the active matrix display backplane 10 is coupled to a rigid substrate 12 (e.g., glass). Also shown is a plurality of blocks 14. These blocks may be fabricated separately and then deposited into holes on substrate 12 by a process known as fluidic self assembly; an example of this process is described in U.S. Pat. No. 5,545,291. These blocks may each contain driver circuitry (e.g., MOSFET and capacitor) for driving a pixel electrode. The active matrix backplane includes transparent pixel electrodes and row/column interconnects (not shown) to electrically interconnect the blocks 14. The plurality of blocks 14 is coupled to the active matrix display backplane 10 and the rigid substrate 12. FIG. 1C shows a reflective display 16 coupled to a rigid substrate 12. FIG. 1D shows a reflective display 16 coupled to a rigid substrate 12. A plurality of blocks 14 is coupled to the reflective display 16 and to the rigid substrate 12.

Placing elements, such as pixel drivers, on a rigid substrate is well known. Prior techniques can be generally divided into two types: deterministic methods or random methods. Deterministic methods, such as pick and place, use a human or robot arm to pick each element and place it into its corresponding location in a different substrate. Pick and place methods generally place devices one at a time and are generally not applicable to very small or numerous elements such as those needed for large arrays, such as an active matrix liquid crystal display.

Random placement techniques are more effective and result in high yields if the elements to be placed have the right shape. U.S. Pat. No. 5,545,291 describes a method that uses random placement. In this method, microstructures are assembled onto a different substrate through fluid transport. This is sometimes referred to as fluidic self-assembly (FSA). Using this technique, various blocks, each containing a functional component, may be fabricated on one substrate and then separated from that substrate and assembled onto a separate rigid substrate through the fluidic self assembly (FSA) process. The blocks which are deposited onto receptor regions of a substrate may include any of a number of different functional components, such as LEDs, pixel drivers, sensors, etc. An example of a particular type of block and its functional component is described in copending U.S. patent application Ser. No. 09/251,220 which was filed Feb. 16, 1999 by the inventor John Stephen Smith and which is entitled "Functionally Symmetric Integrated Circuit Die". This application is hereby incorporated herein by reference.

As noted above, FIGS. 1B and 1D illustrate a display substrate 12 with blocks 14 formed in the rigid substrate 12. These blocks 14 may be deposited through an FSA process. In the FSA process, a slurry containing the blocks 14 is deposited over the rigid substrate 12 and the blocks 14 rest in corresponding openings in the substrate 12.

FIG. 2 shows a block 14 and a circuit element (not shown) on the top surface 18 of block 14. Generally, blocks have a trapezoidal cross-section where the top of the block is wider than the bottom of the block 14.

FIG. 3 shows blocks 14 in a recessed region of the rigid substrate 12. Between the block and the rigid substrate is an metallization layer 13. The block 14 has a top surface 18.

FIG. 4 shows a planar side view of a rigid substrate coupled to a rigid display backplane with a plurality of blocks 14 between the display backplane 30 and substrate 12. The plurality of blocks 14 are functionally part of the display backplane 30 and are deposited onto receptor regions of the substrate 12. Each block 14 drives at least one transparent pixel electrode. The pixel electrode is fabricated over a transistor which is fabricated in the block 14.

FIG. 5 shows a portion of an array in an active matrix display backplane. The control line rows 31 and 32 in this device are coupled to gate electrodes along a row and the control line columns 34 and 35 are coupled to data drivers which supply pixel voltages which are applied to the pixel electrodes. A column line 34 is connected to a source electrode of field effect transistor (FET) 36. Another column line 35 is coupled to a source electrode of FET 37. A row line 32 is coupled to the gates of both FETs 36 and 37. The drain of FET 36 is coupled through capacitor 38 to a transparent pixel electrode along the row 32 formed by FETs 36 and 37, and the drain of FET 37 is coupled through a capacitor to another pixel electrode along the row. In one typical example, the backplane may be formed by depositing blocks, using an FSA technique, into a rigid substrate (e.g., glass); each block contains a FET and a capacitor and is interconnected to other blocks by column and row conductors that are deposited onto the rigid substrate; and, the capacitor is coupled to a pixel electrode by another conductor that is deposited onto the rigid substrate. The active medium (e.g., a liquid crystal) is deposited at least on the pixel electrodes which will optically change the active medium's properties in response to the combined voltages or currents produced by the pixel electrodes. The active medium at a given pixel electrode 42 will appear as a square or dot in the overall checkerboard type matrix of the display. The actual size of the FETs and the pixel electrodes 42 are not now drawn to scale, but are shown schematically for the purposes of illustration. FIG. 6 shows pixel electrodes 46 on top of a substrate 48.

While the foregoing discussion explains how displays are generally made, an important feature of the displays involves blocks with circuit elements thereon that become tilted in recessed regions of the substrate. Blocks which are not properly seated in a recessed region of a substrate may not operate or inadequately operate thereby reducing the resolution in a display. Second, improperly seated blocks prevent the blocks from being properly electrically connected.

SUMMARY OF THE INVENTION

The present invention relates to apparatuses and methods of rolling blocks with integrated circuits thereon into recessed regions of a rigid or flexible substrate used to form a display or other assembly of components. One embodiment shows that a roller (or press) directly contacts the substrate in order to roll or press the blocks into recessed regions of the substrate. Another embodiment of the invention relates to material being placed between the roller and the blocks which are at least partially in the recessed regions of the substrate. By rolling or pressing the blocks into the substrate, the connection between the blocks is improved thereby increasing yield of good product for a display or other assembly of components.

While an array of components (e.g. display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following Figures.

BRIEF DESCRIPTION OF THE DRAWINGS

The present invention is illustrated by way of example. The invention is not limited to the figures of the accompanying drawings in which like references indicate similar elements. Additionally, the elements are not drawn to scale.

DETAILED DESCRIPTION

The following description and drawings are illustrative of the invention and are not to be construed as limiting the invention. The present invention relates to a method and a device for forming displays wherein blocks with integrated circuits thereon are improperly seated in recessed regions of a substrate and these blocks are rolled or pressed into a substrate. A display panel is then coupled to a substrate.

Rolling or pressing blocks into substrate is applicable to all displays known in the art such as LEDs, OLEDs, LCDs, transmissive displays, displays having EL materials, or EP materials. One embodiment of the invention includes rolling or pressing blocks into a flexible continuous substrate upon which multiple flexible displays are fabricated. The multiple flexible displays may be of similar or different sizes. These displays are separated from one another as the substrate is advanced through the web processing apparatus. The blocks are contained in a slurry which is deposited onto the flexible substrate. Although blocks may be comprised of single crystal silicon or other like material which makes the block rigid, the substrate may still be flexible because the size of these blocks (50×100 microns or 100×100 microns) is small in comparison to the flexible substrate. The flexible substrate forms part of a display backplane. In the following description, numerous specific details such as specific materials, processing parameters, processing steps, etc., are set forth in order to provide a thorough understanding of the invention. One skilled in the art will recognize that these details need not be specifically adhered in order to practice the claimed invention. In other instances, known processing steps, materials, etc. are not set forth in order not to obscure the invention.

Figure 1A:
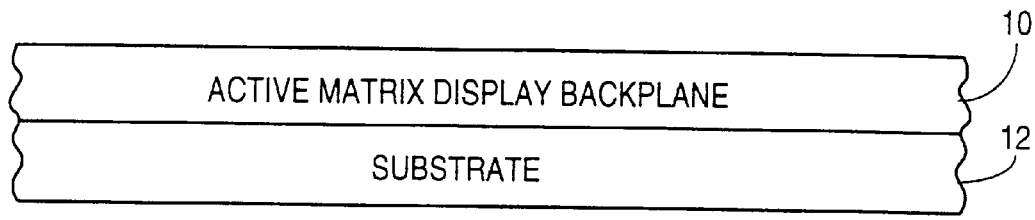
FIG. 1A shows a planar side view of an active matrix display backplane coupled to a rigid substrate.
Figure 1B:
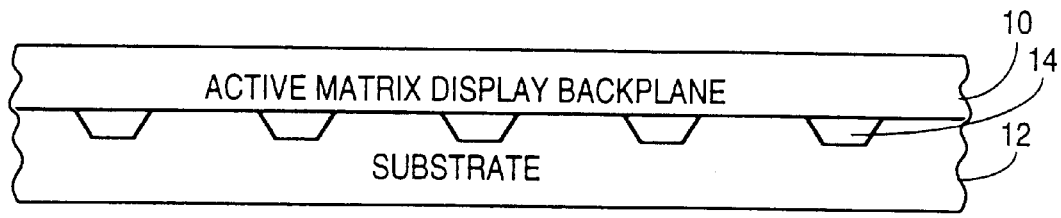
FIG. 1B shows a planar side view of an active matrix display backplane coupled to a rigid substrate wherein a plurality of blocks are part of the active matrix display.
Figure 1C:
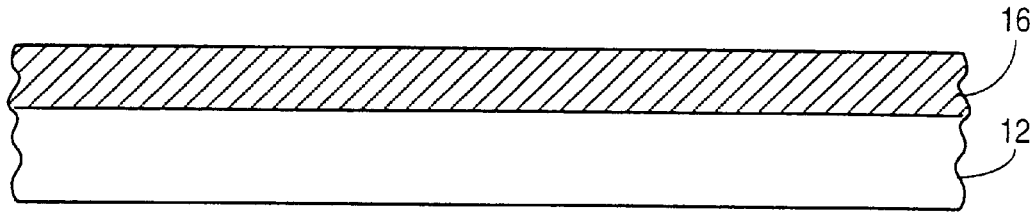
FIG. 1C shows a planar side view of a reflective display backplane coupled to a rigid substrate.
Figure 1D:
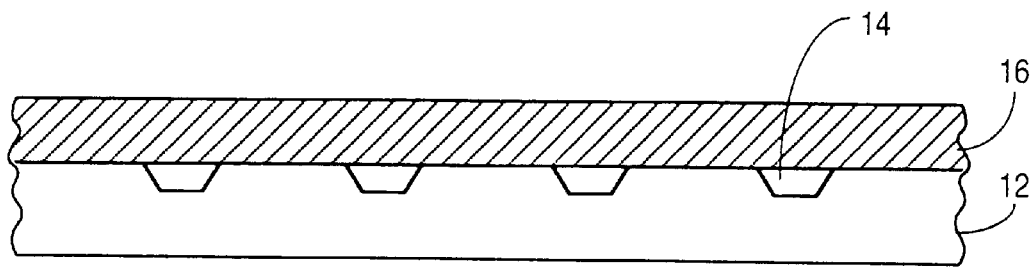
FIG. 1D shows a planar side view of a reflective display backplane coupled to a rigid substrate wherein a plurality of blocks are coupled to the reflective display and to the rigid substrate.
Figure 2:
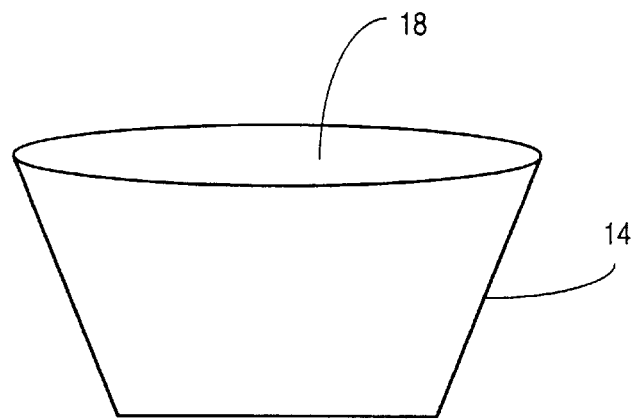
FIG. 2 shows a top perspective view of a circuit element block.
Figure 3:
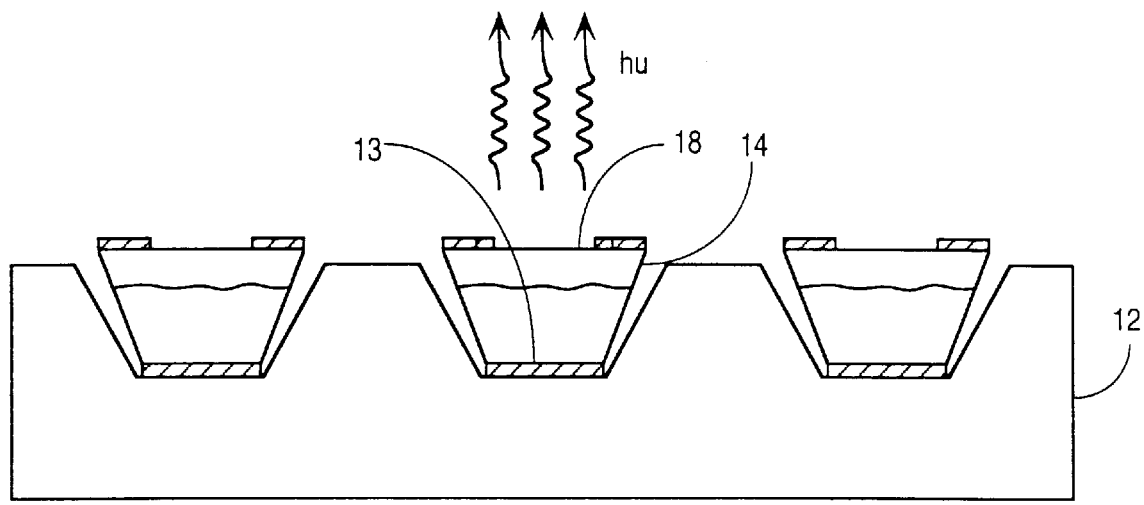
FIG. 3 shows a planar side view of blocks in recessed regions of the rigid substrate and a metalization surface on the blocks.
Figure 4:
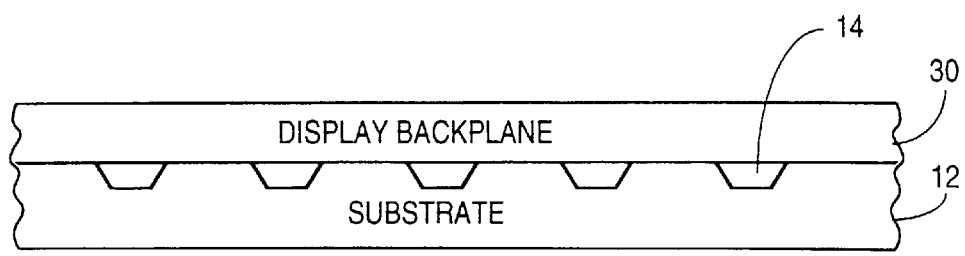
FIG. 4 shows a planar side view of a rigid substrate coupled to a rigid display backplane with a plurality of blocks between the display backplane and substrate.
Figure 5:
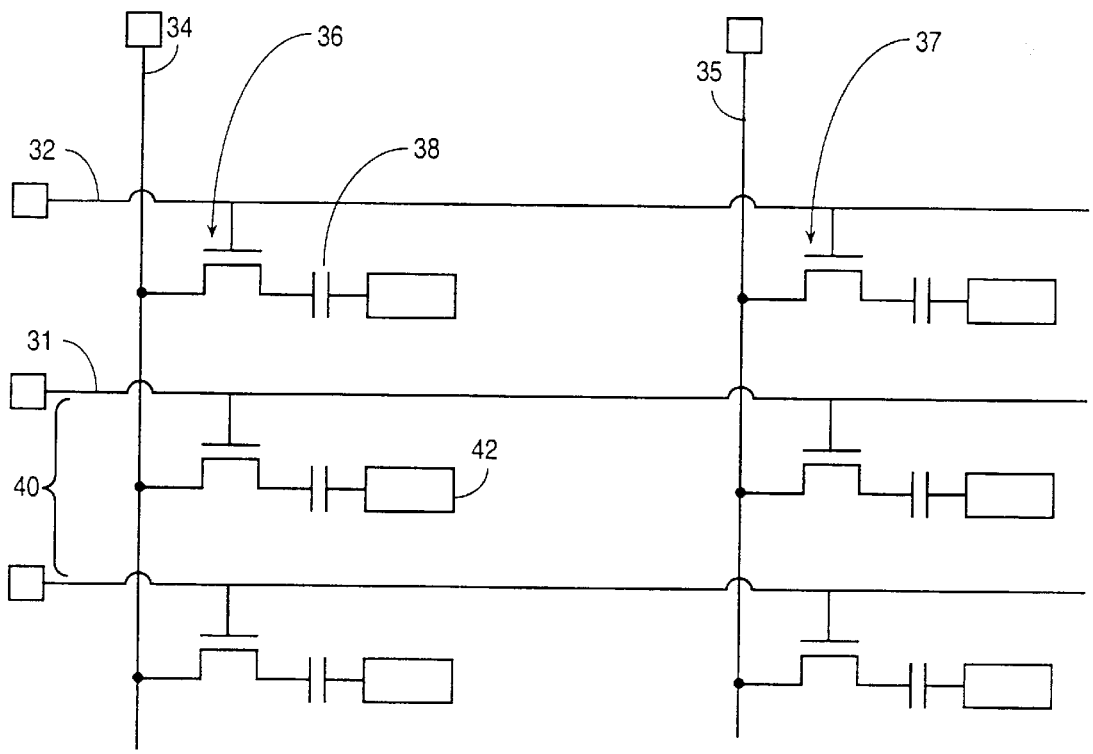
FIG. 5 schematically represents a portion of an array of an active matrix backplane.
Figure 6:
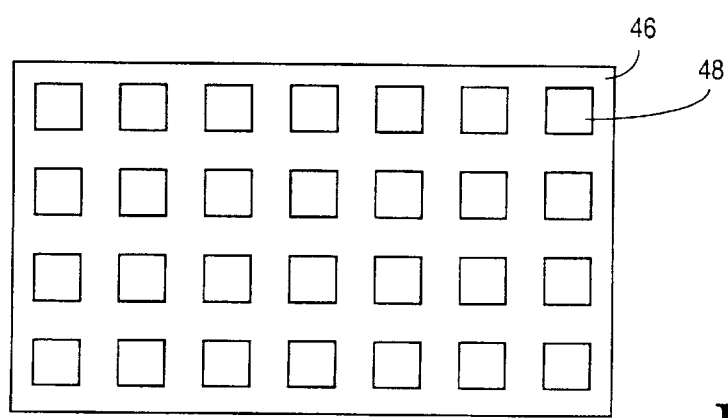
FIG. 6 shows a top view of a plurality of pixel electrodes in a backplane.
Figure 7A:
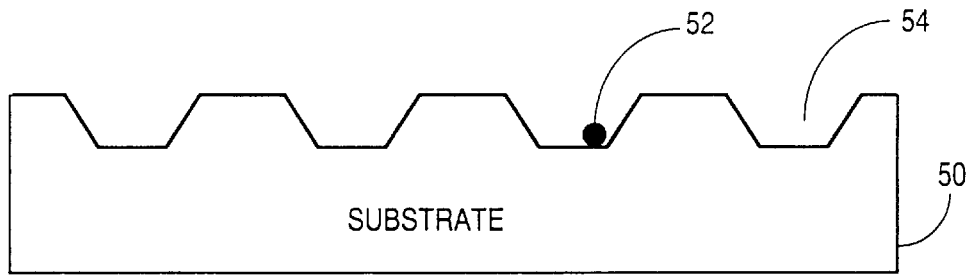
FIG. 7A shows a planar side view of a flexible substrate wherein a foreign particle is in the recessed region of a flexible substrate.
Figure 7B:
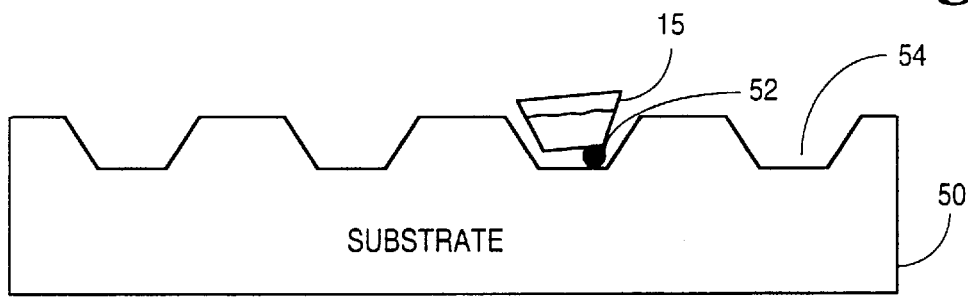
FIG. 7B shows a planar side view of a flexible substrate wherein a block along with the foreign particle is in the recessed region of a flexible substrate.
Figure 7C:
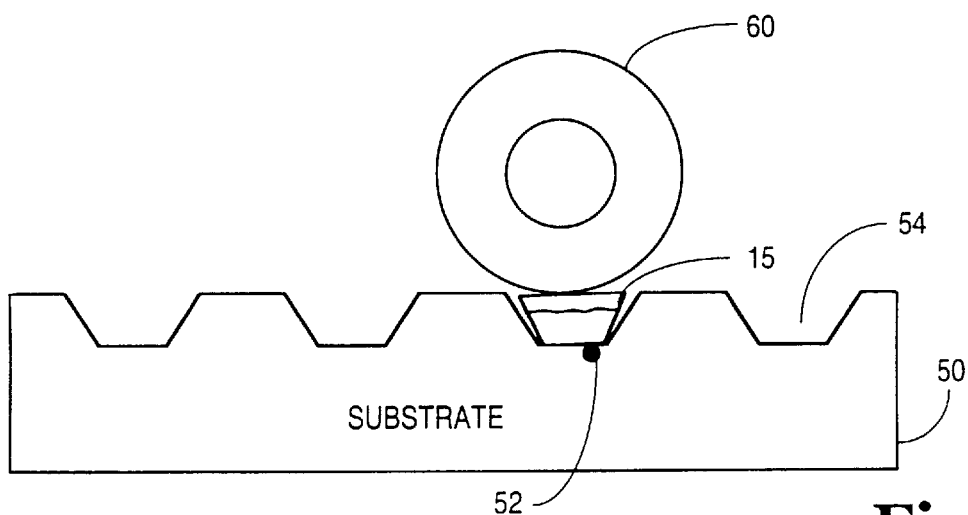
FIG. 7C shows a planar side view of a flexible substrate wherein a roller is used to press a block along with the foreign particle into the recessed region of a flexible substrate.
Figure 7D:
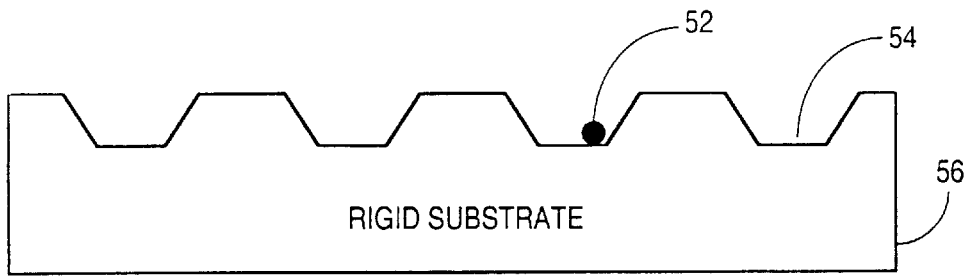
FIG. 7D shows a planar side view of a rigid substrate wherein a foreign particle is in the recessed region of a rigid substrate.

FIG. 7A shows a planar side view of a flexible substrate 50 wherein a foreign particle 52 is in the recessed region 54 of a flexible substrate 50. For example, foreign particles 52 are any objects that are unnecessary for the creation of a display. This may be dust or airborne particles which settle onto the substrate or block. FIG. 7B shows a planar side view of a flexible substrate 50 wherein a block 15 and a foreign particle 52 is in a recessed region 54 of a flexible substrate 50. The foreign particle 52 is between the surface of the recessed region 54 and the block 15. This causes the block 15 to be tilted in a recessed region 54. FIG. 7C shows a planar side view of a flexible substrate 50 wherein a roller 60 is used to press a block and the foreign particle into the recessed region of a flexible substrate. The block 15 may be comprised of gallium arsenide or like material making the block 15 generally harder than the substrate. FIG. 7D shows a planar side view of a rigid substrate 56 wherein a foreign particle 52 is in the recessed region of rigid substrate 56. The rigid substrate 56 may be comprised of glass, borosilicate glass, soda lime glass or quartz.

Figure 7E:
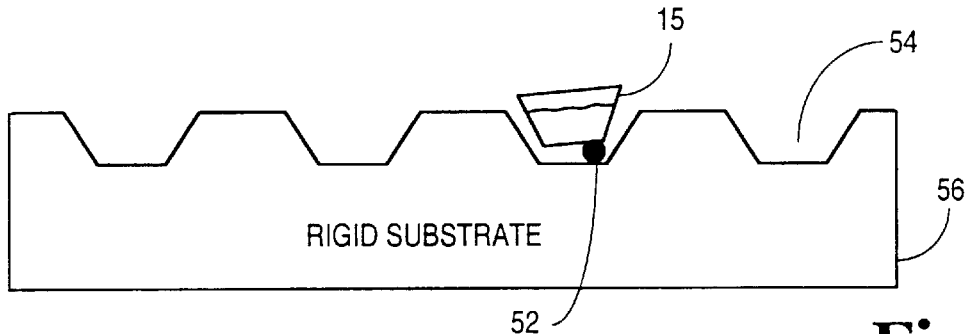
FIG. 7E shows a planar side view of a rigid substrate wherein a block along with the foreign particle is in the recessed region of a rigid substrate.
Figure 7F:
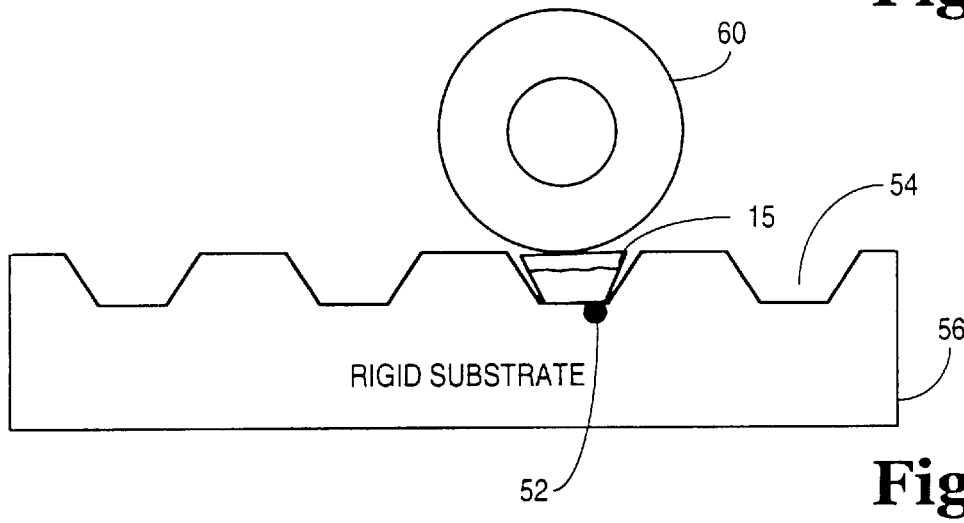
FIG. 7F shows a planar side view of a rigid substrate wherein a roller is used to press a block along with the foreign particle into the recessed region of a rigid substrate.
Figure 7G:
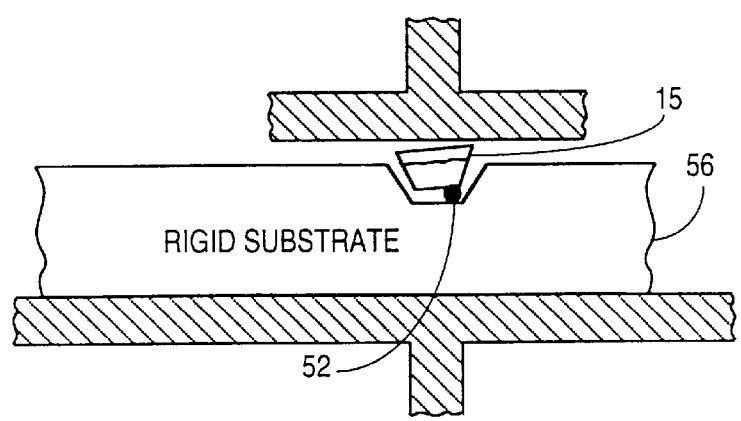
FIG. 7G shows a planar side view of a rigid substrate wherein a press is used to press a block along with the foreign particle into the recessed region of a rigid substrate.
Figure 7H:
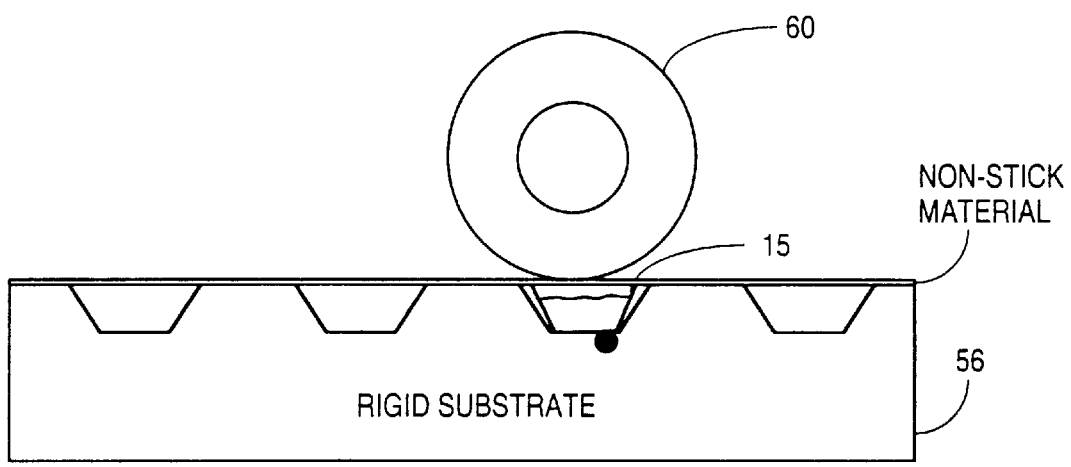
FIGS. 7H–7I shows a planar side of a substrate wherein a sheet of material is placed between a roller or press and the substrate.
Figure 7I:
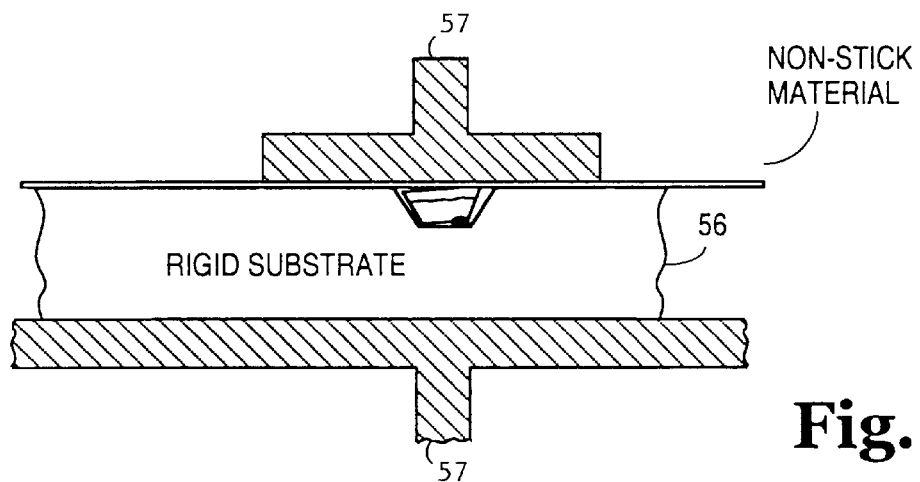

FIG. 7E shows a planar side view of a rigid substrate 56 wherein a block 15 and foreign particle 52 is in the recessed region of a rigid substrate 56. FIG. 7F shows a planar side view of a rigid substrate 56 wherein a roller 60 is used to roll or press a block and the foreign particle into the recessed region of a rigid substrate 56. The roller itself may have a nonstick coating (e.g., Teflon polyester or polyethylene) on the outer surface of the roller 60. The Teflon may include, but is not limited to, tetrafluoroethylene, polytetrafluoroethylene, fluorinated compounds such as perfluorinated ethylenepropylene, polyfluoroethylene, copolymer of tetrafluoroethylene with (perfluoro)alkyl-vinyl ether, PFA (e.g. perfluoroalkoxyl, perfluoroalkoxy polymer, perfluoroalkylvinyl ether, copolymer, perfluorovinylalkylethertetrafluoroethylene copolymer, perfluoroalkoxyethylene, co-polytetrafluoroethylene-perfluoroalkoxy), FEP, PTFE, and PVDF. FIG. 7G shows a planar side view of a rigid substrate 56 wherein a press is used to press a block along with the foreign particle into the recessed region of a rigid substrate 56. The press may be hand-held or a mechanical press. FIG. 7H shows a sheet of material comprising of a nonstick material (e.g., Teflon with metallic particles, polyethylene, polyester) that is placed between the roller 60 and a substrate. The substrate may be rigid or flexible. FIG. 7I shows a sheet of nonstick material (e.g., Teflon with metallic particles, polyethylene, polyester) between press 57 and the substrate. The substrate may be rigid or flexible.

Figure 8:
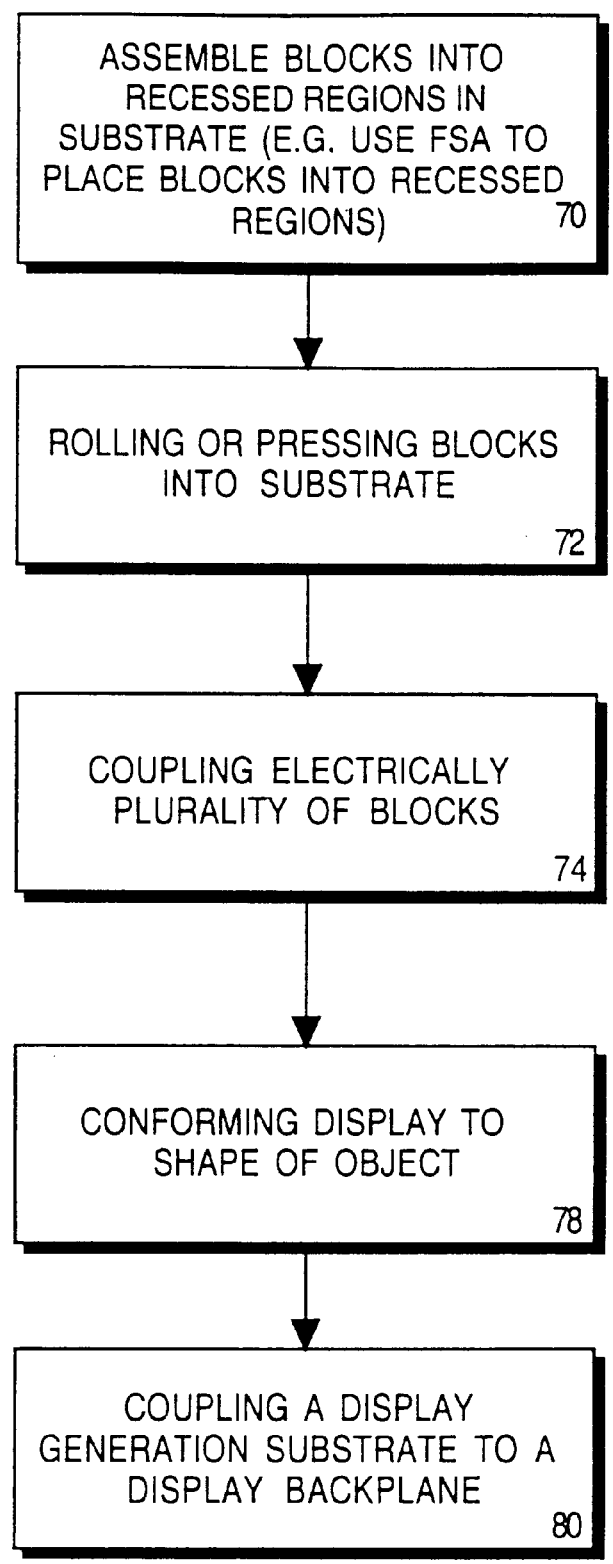
FIG. 8 shows a flow chart of the method of rolling or pressing blocks into recessed regions of a substrate.

FIG. 8 shows a flow chart of the method of rolling or pressing blocks into recessed regions of a substrate. FIG. 8 specifically shows one method of assembling a flexible display along the length of a flexible substrate at operation 70 in accordance with an embodiment of the invention. First, blocks are assembled into the openings of the flexible substrate. Utilizing an FSA process, a plurality of blocks are deposited in a slurry that go into the recessed regions of the flexible substrate. Rolling or pressing blocks into a substrate at operation 72. Then, the electrical coupling of the plurality of blocks takes place at operation 74 by opening holes in a layer and depositing metalization material or other conductive materials into the holes and beyond the holes to form an interconnect (e.g., a row or column interconnect). The display is made to conform the object's shape at operation

78. It should be noted that the operations for forming the display may be done in a different order than described herein and thus the operation 78 may be performed after operation 80. A display generation substrate (e.g., a PDLC layer) is coupled to the active matrix backplane 80.

Figure 9A:
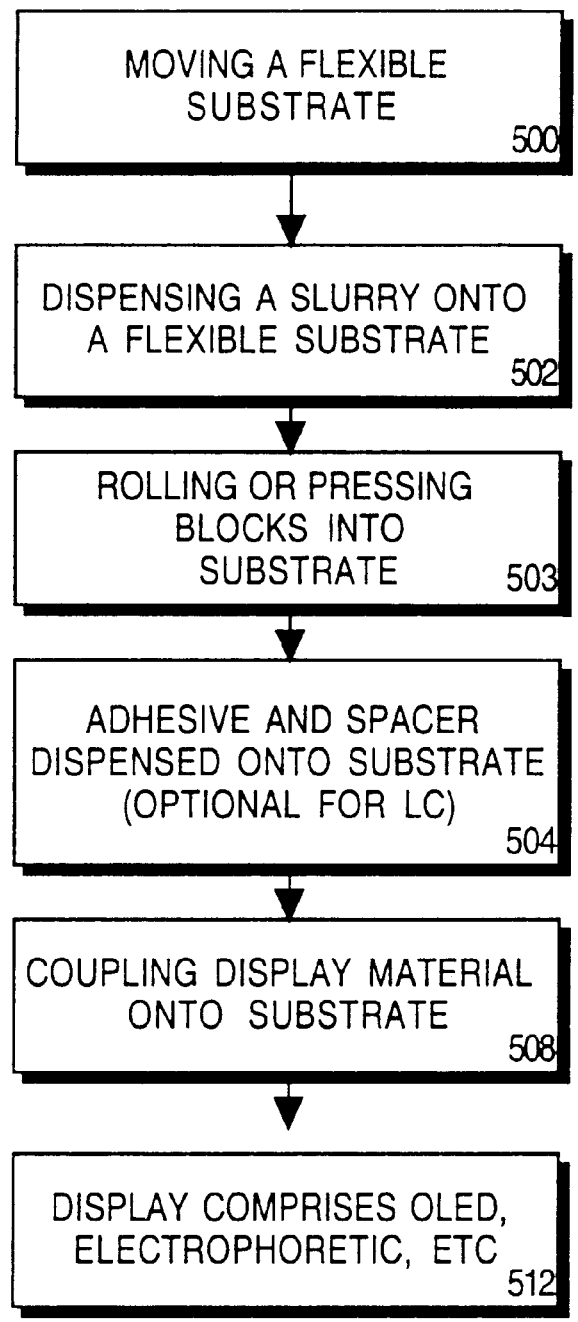
FIG. 9A shows a flow chart of a method of fabricating a display device wherein blocks are rolled or pressed into a flexible or rigid substrate. A display tape undergoes a separate processing and the display tape is subsequently coupled to the substrate.

FIG. 9A shows a method of fabricating a display device wherein a flexible substrate and a display tape undergo processing and are subsequently coupled. There, the flexible substrate is advanced along a process line at operation 500. A slurry containing a plurality of blocks is dispensed onto the flexible substrate at operation 502. A second slurry containing a plurality of blocks is again dispensed onto the substrate. Excess slurry is collected in a container and is recycled. The blocks fall into recessed regions in the substrate. Blocks are subsequently rolled or pressed into recessed regions of the substrate 503. Adhesives and spacers are deposited onto the substrate at operation 504. Display material is placed onto the substrate at operation 508. This material may comprise polymer-dispersed liquid crystal, cholesteric liquid crystal, electrophoretic liquid crystal, upconverting phosphor, downconverting phosphor, or OLEDs at operation 512.

Figure 9B:
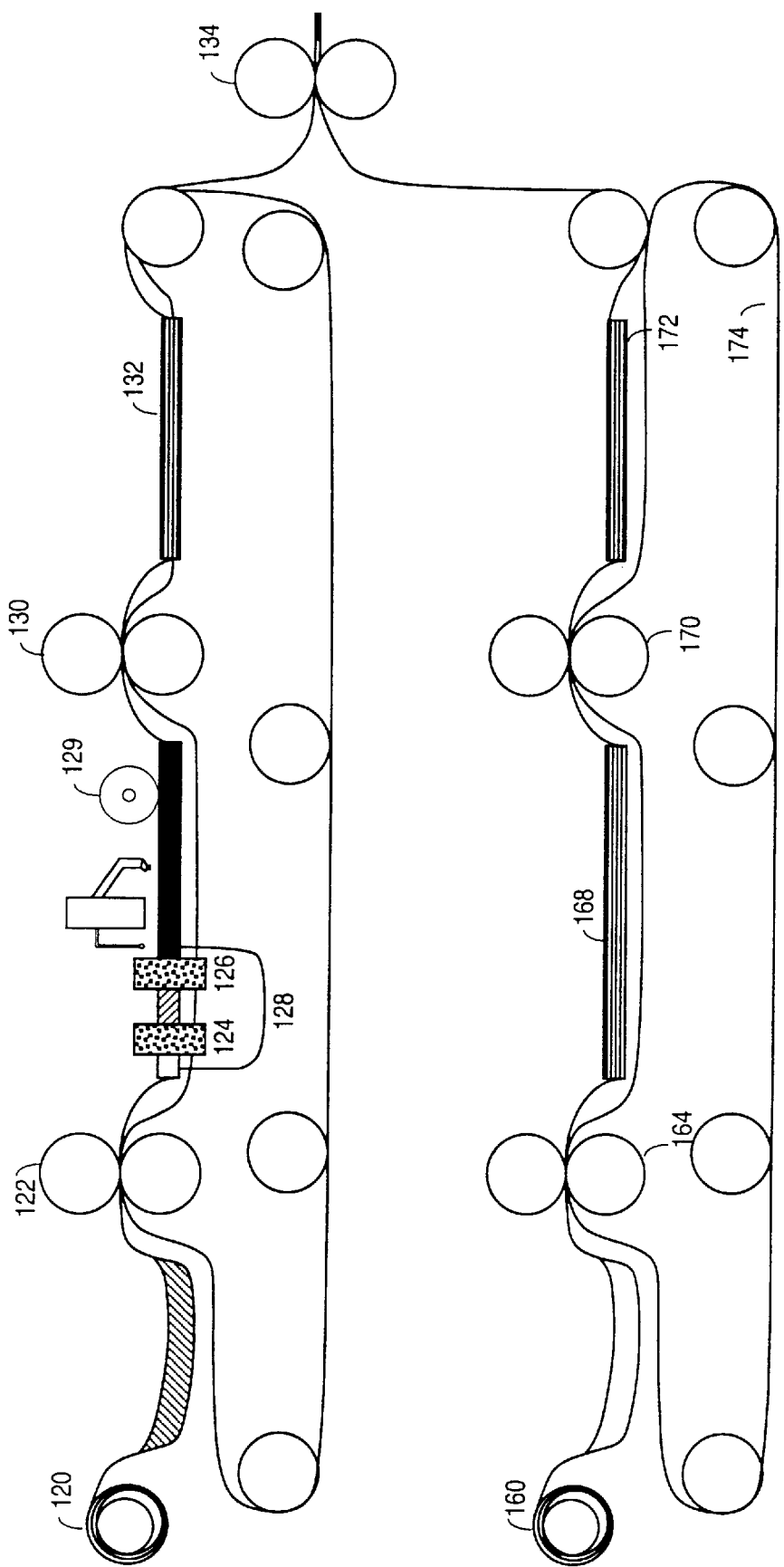
FIG. 9B shows schematically a method of fabricating a display device wherein blocks are rolled into a flexible or rigid substrate and a display tape undergoes processing. The flexible or rigid substrate and the display tape are subsequently coupled.

FIG. 9B shows the overall process of fabricating a display device wherein a flexible substrate 120 and a display tape 160 undergo processing and are subsequently coupled. There, the flexible substrate is advanced along a first process line and advances through a first set of support members 122. A first slurry 124 containing a plurality of blocks is dispensed onto the flexible substrate. A second slurry 126 containing a plurality of blocks is again dispensed onto the substrate. Excess slurry is collected in a container 128 and is recycled. The blocks fall into recessed regions in the substrate. Empty recessed regions have blocks robotically placed into the empty regions. Tilted blocks are rolled (or, alternatively pressed) into place at operation 129. Flexible substrate 120 is advanced through a second set of support members 130. At operation 132, an interconnect is deposited onto flexible substrate 120. The flexible substrate is then advanced to point 134. In conjunction with this process, display tape 160 undergoes a separate process. Display material is placed onto at least one side of the display tape 160. Display tape 160 is advanced through a first set of support members 164. The display material is patterned or layered 168. This display material may comprise polymer-dispersed liquid crystal, cholesteric liquid crystal, electrophoretic liquid crystal, upconverting phosphor, or downconverting phosphor. Display tape 160 is advanced through a second set of support members 170. An interconnect 172 is either deposited or etched onto the display tape 160. The display tape is then advanced to point 134 where the display tape is coupled to the substrate. A conveyor belt 174 surrounds the support members.

Figure 10:
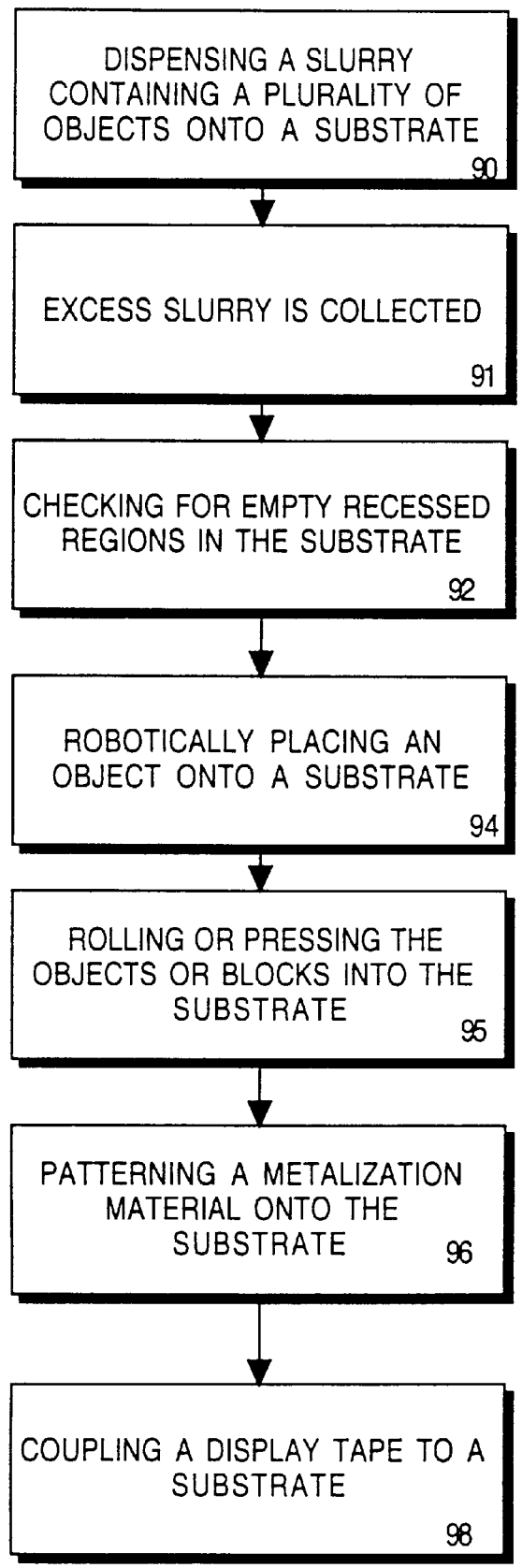
FIG. 10 shows that rolling or pressing of the substrate may occur after objects are robotically placed in the substrate.

FIG. 10 relates to a method of picking and placing of objects onto a flexible substrate after the FSA process has been applied to the substrate. A slurry containing a plurality of objects is dispensed onto the substrate at operation 90. The objects fall into recessed regions in the substrate. The excess slurry is collected and recycled at operation 91. The substrate is checked for empty recessed regions at operation 92. This checking is performed by an electronic eye which views the substrate. Objects are robotically placed into empty regions found in substrate at operation 94. The blocks are physically rolled or pressed into the substrate by a roller or press at operation 95. This may be done by the roller directly or indirectly contacting the blocks. A sheet of material (e.g., teflon) may be used between the roller and the blocks. If the roller directly contacts the substrate, the surface of the roller is made of a material (e.g., teflon) which does not cause the substrate to be damaged. A metalization material is placed onto at least one of the substrate's surfaces and is patterned or etched at operation 96. The display tape is coupled to the substrate at operation 98.

Figure 11:
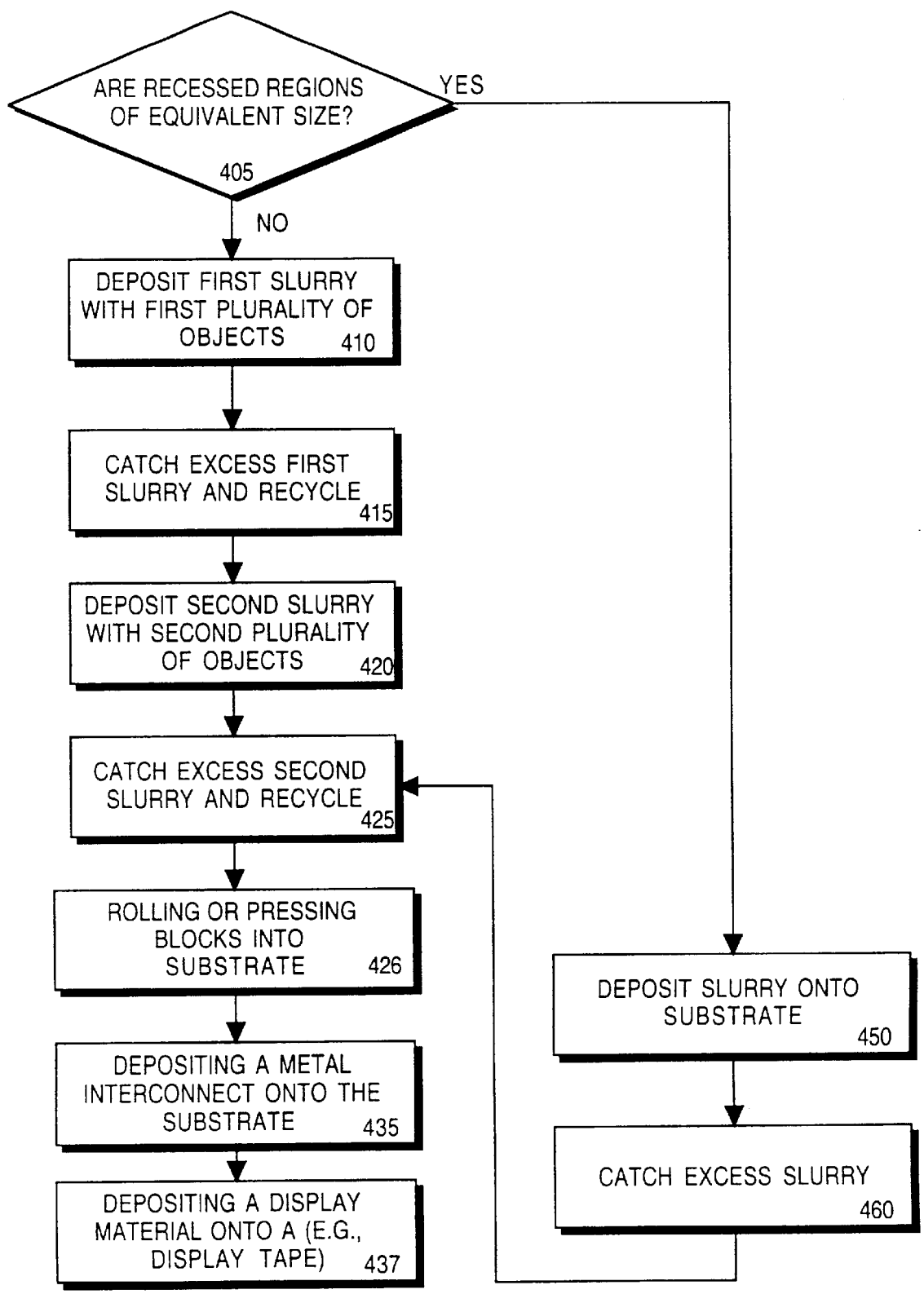
FIG. 11 shows a flow chart wherein various sized blocks are rolled or pressed into the it substrate.

FIG. 11 relates to the FSA process and the coupling of the display material with the substrate. If the recessed regions are not of equivalent size, a slurry containing a plurality of blocks is deposited onto the substrate at operation 410. (If the recessed regions are of equivalent size, operation 450 is then followed wherein slurry is deposited onto the substrate. At operation 460, excess slurry is caught by some type of conductor container and is recycled.) Excess slurry is caught and recycled at operation 415. Once this is performed, a second slurry with a second plurality of objects is placed onto the substrate at operation 420. Excess second slurry is recycled into a second container at operation 425. The blocks are rolled or pressed into recessed regions of the substrate at operation 426. A metal interconnect is then deposited onto the substrate at operation 435. The interconnect between the rows and columns is comprised of flexible and conductive material. For example, the interconnect could be made of conductive polymers, metals (e.g., aluminum, copper, silver, gold, etc.), conductive organic compounds, or conductive oxides. After these operations, a display material is deposited onto the substrate at operation 437.

Figure 12:
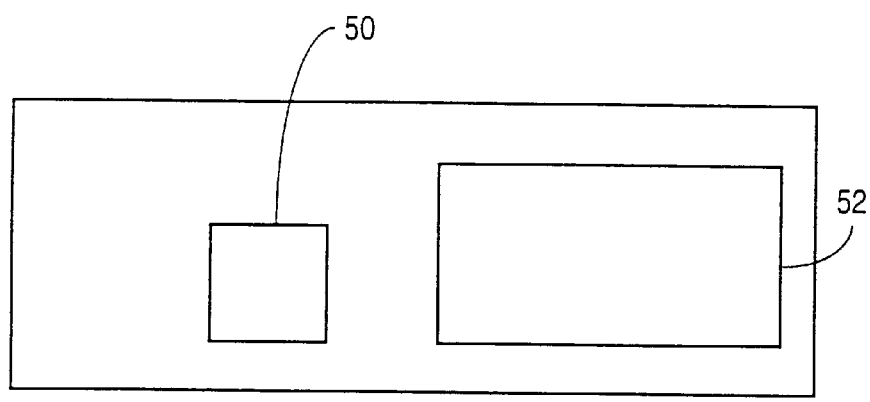
FIG. 12 shows different sized recessed regions.
Figure 13:
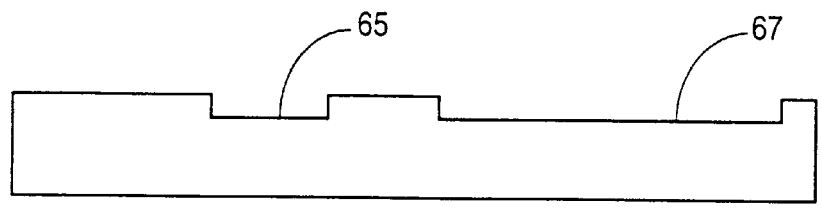
FIG. 13 shows a cross-sectional view of different sized recessed regions in a substrate.

FIG. 12 shows a substrate that has different sized recessed regions. Although rectangular recessed regions are shown, this is for the purpose of illustration only. The recessed regions may be a variety of shapes depending upon the objects that they are to receive. This allows the substrate to receive various sized blocks (50 and 52) or devices. Rolling or pressing different sized blocks or devices into place may occur after equivalent sized blocks or devices are dispensed onto a substrate with recessed regions. Alternatively, rolling or pressing the objects into place may occur after all of the different sized objects are dispensed onto the substrate. FIG. 13 shows a cross-sectional view of the recessed regions in the substrate. Recessed region 65 is smaller than recessed region 67.

Figure 14:
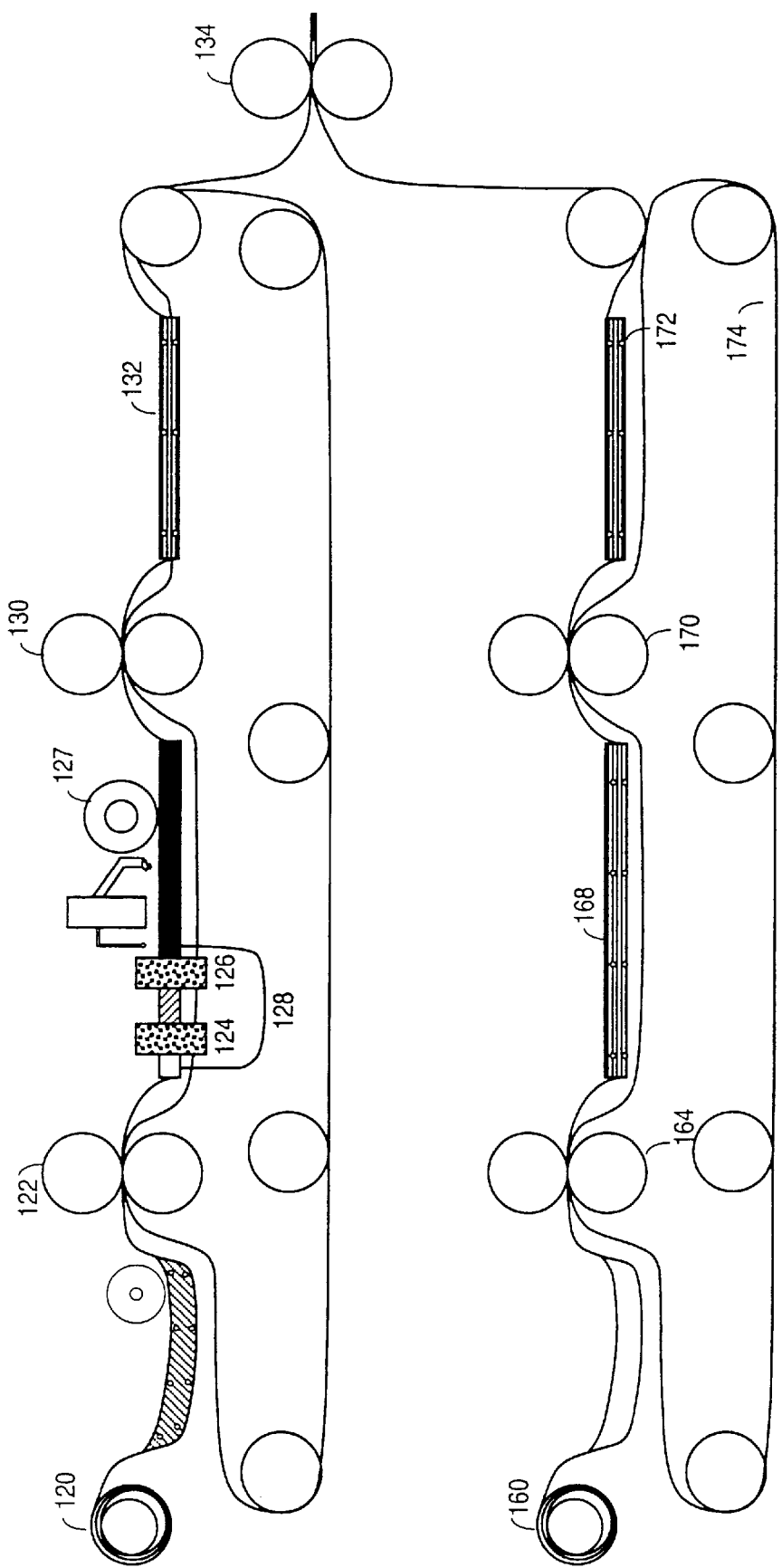
FIG. 14 shows another embodiment of an in-line process of the invention wherein a continuous substrate and web material are processed.

FIG. 14 shows an embodiment of the overall in-line process of the invention. A web apparatus machine 119 is used to process the substrate. At operation 120, apertures 121 are created in the flexible substrate. These apertures can be created by a number of methods. For example, the apertures can be punched into the substrate. Another method involves using a template to create apertures. A laser could also be used to create the apertures. The substrate advances over a plurality of support members 122. The FSA process is applied to the substrate. FSA comprises a slurry which contains a plurality of functional blocks. These blocks have, in one embodiment, a circuit element (not shown) which drives the picture element (not shown). The FSA process occurs at operation 124. It is then applied again at operation 126. The blocks are then rolled or pressed into the substrate at operation 127. This ensures that the blocks do not tilt in the recessed region. In other words, by rolling the blocks into the recessed region, the blocks are properly seated in the recessed region allowing the blocks to operate correctly. The excess slurry is collected in container 128. Then, the flexible substrate advances through support members 130. The flexible substrate then has an interconnect deposited on the top of the flexible substrate 132. The resulting flexible substrate advances over a guide member and meets at a point 134 wherein it is coupled to a display tape which in one embodiment is a flexible substrate which includes separate regions each having a display material on this flexible substrate. A different portion of the process involves the display tape 160. Before the display tape is coupled with the substrate, the display tape goes through its own separate process which is described below. (If a rigid substrate is used, heat may be applied to the rigid substrate to soften the rigid substrate in order to more easily create recessed regions or apertures to receive blocks.) A variety of methods may be used to heat the rigid substrate such as by heating material adjacent to the rigid substrate (e.g., conductors), applying heat to the rigid substrate 56 itself or convection.

The display tape has display material deposited on at least one side of the display tape. There are a variety of ways which display material may be deposited onto the display tape. For example, display material may be sprayed onto the display tape; the display material also may be placed on a screen over the display tape; or the display tape may be placed into a container which holds the display material. The display tape advances through support members 164. The display tape then has display material layered or patterned on the display tape at 168. This display tape then advances through another plurality of support members 170. A large area metal interconnect is then deposited or etched onto the display tape 172. This may be performed by inkjet, lithography and etch, screen print, laser etch, or deposit 174. In one embodiment of the invention, this large interconnect is a cover glass electrode. At point 134, the display tape is coupled with a substrate.

Figure 15:
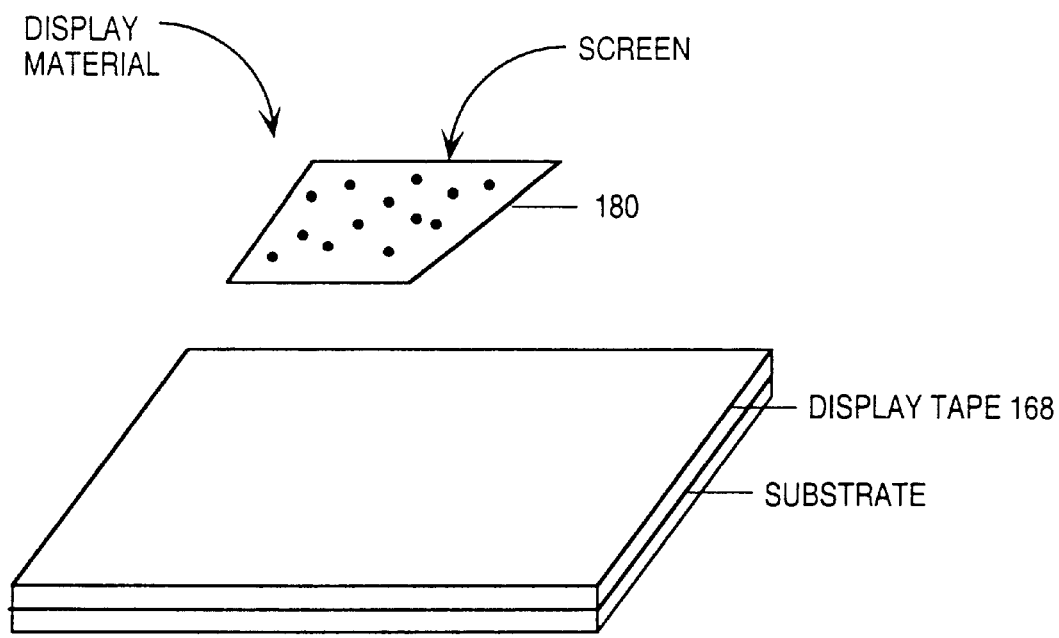
FIG. 15 shows display material being screen printed.

FIG. 15 shows a display material being placed through a screen 180 onto display tape 168. The screen 180 has a desired pattern created by holes which go through the screen 180. This desired pattern may be dictated by a customer or by the manufacturer.

Figure 16:
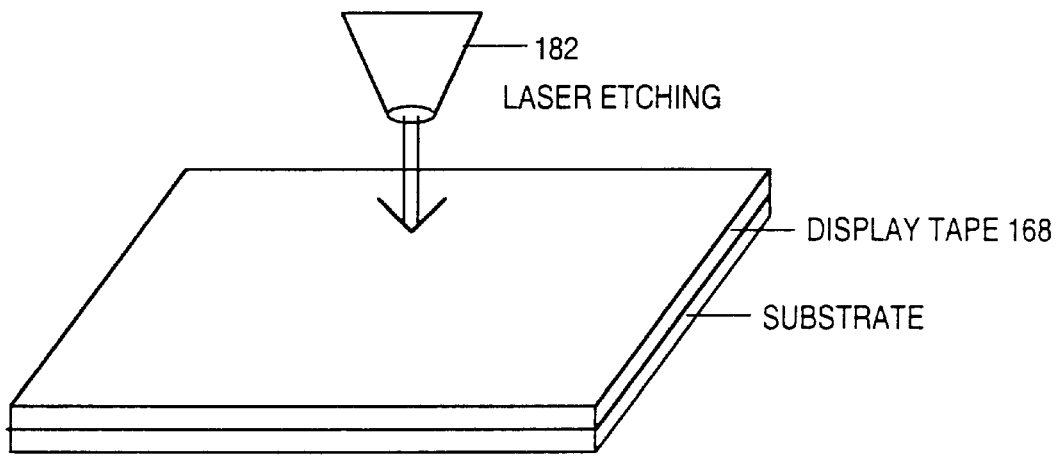
FIG. 16 shows display material being laser etched.

Another method of placing display material onto the display tape is shown in FIG. 16. FIG. 16 shows a top view of display material being laser etched onto display tape 168. The etching occurs when the high intensity light from the laser 182 strikes the display material on top of the display tape 168. A pattern is created in the display material by the laser 182.

Figure 17:
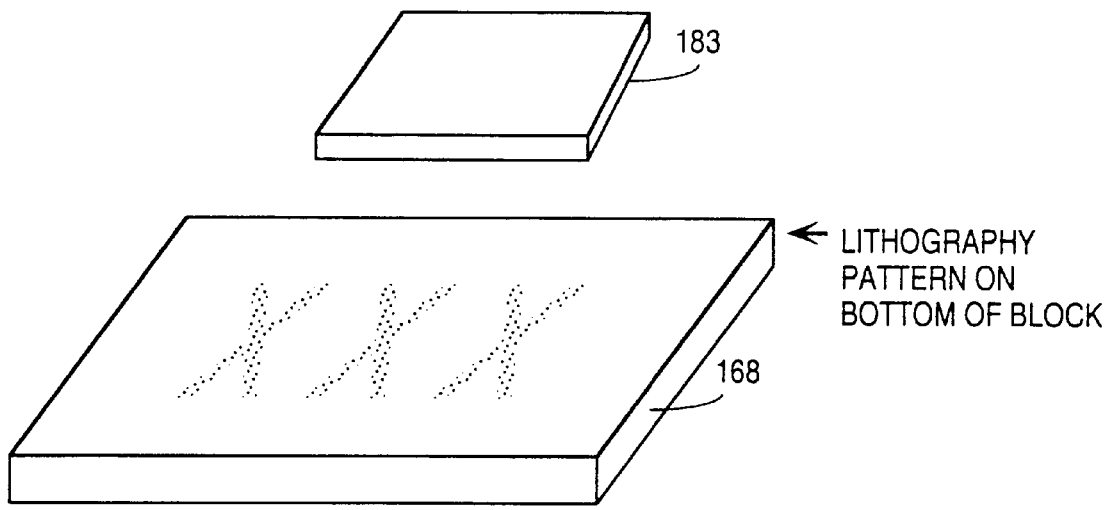
FIG. 17 shows lithography being used to pattern display material.

Another method of depositing display material is shown in FIG. 17. FIG. 17 shows lithography being used to pattern the display material. Lithography involves using a block 183 with a pattern engraved in the bottom surface of the block 183. The bottom surface of the block 183 contacts the display material.

Figure 18:
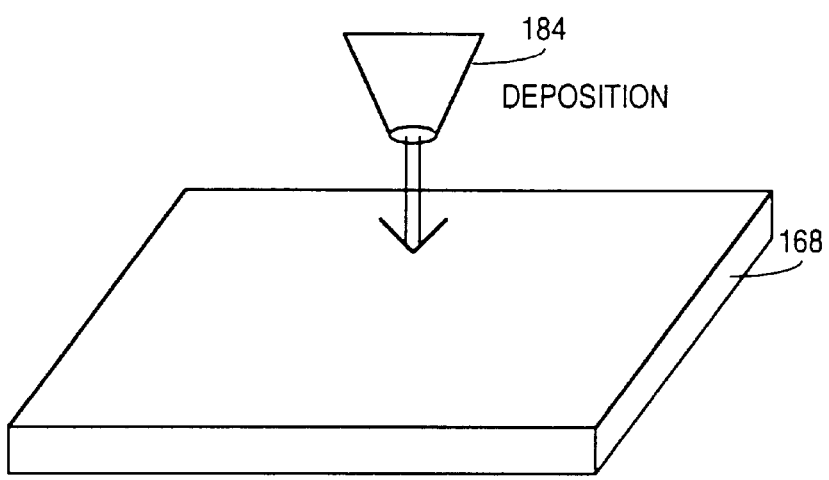
FIG. 18 shows display material being deposited in a pattern.

FIG. 18 shows yet another method of depositing display material onto the display tape. There, display material is deposited in a pattern onto the display tape 168. The display material is deposited by a container 184 which contains the display material. The container 184 is placed over the display tape 168. The display material drops onto the display tape 168 in a pattern.

While an array of components (e.g. display components) for an assembly have been described as examples of the invention, an array of other assemblies such as x-ray detectors, radar detectors, micro-electro-mechanical structural elements (MEMS) or, generally, an assembly of sensors or actuators or an assembly of circuit elements also may be produced using the claimed invention. Thus, for example, flexible antennas, other sensors, detectors, or an array of circuit elements may be fabricated using one of the embodiments of the inventions. Other aspects and methods of the present invention as well as apparatuses formed using these methods are described further below in conjunction with the following figures.

Listed below are related U.S. Patent Applications and U. S. Patent that describe various improvements to the methods and devices of the invention described herein. These patent applications and U. S. Patent are incorporated by reference.

Co-pending U.S. patent application Ser. No. 09/270,146, entitled "Apparatuses and Methods for Forming Assemblies, "(Docket No. 003424.P008), filed by Jeffrey J. Jacobsen and assigned to the same Assignee as the present invention, describes a method and apparatus of assembling flexible displays. This co-pending application is hereby incorporated herein by reference.

Co-pending U.S. patent application Ser. No. 09/270,157, entitled "Methods for Transferring Elements From A Template To A Substrate" (Docket No. 003424.P009), filed by Jeffrey J. Jacobsen, Mark A. Hadley, and John Stephen Smith and assigned to the same Assignee of the present invention, describe an FSA on a template with transfer to another substrate. These co-pending applications are hereby incorporated herein by reference.

Co-pending U.S. patent application Ser. No. 09/270,159, entitled "Methods and Apparatuses for Fabricating A Multiple Module Assembly" (Docket No. 003424.P010), filed by Jeffrey J. Jacobsen, Glenn Wilhelm Gengel, and Gordon S.W. Craig and assigned to the same Assignee as the present invention, describes an electronic modular assembly. This co-pending application is hereby incorporated herein by reference.

Co-pending U.S. patent application Ser. No. 09/270,147, entitled "Apparatuses and Methods Used in Forming Electronic Assemblies" (Docket No. 003424.P011), filed by Jeffrey J. Jacobsen, Glenn Wilhelm Gengel, and John Stephen Smith and assigned to the same Assignee as the present invention, describes a method of molding substances. This co-pending application is hereby incorporated herein by reference.

Co-pending U.S. patent application Ser. No. 09/268,755, entitled "Web Process Interconnect in Electronic Assemblies" (Docket No. 003424.P012), filed by Jeffrey J. Jacobsen, Glenn Wilhelm Gengel, Mark A. Hadley, Gordon S. W. Craig, and John Stephen Smith and assigned to the same Assignee as the present invention, describes a method of creating various interconnects on a web tape. This co-pending application is hereby incorporated herein by reference.

Patent No. 5,545,291 entitled "Method for Fabricating Self-Assembling Microstructures," filed by John S. Smith and Hsi-Jen J. Yeh, issued Aug. 13, 1996.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method for fabricating an assembly, said method comprising:

dispensing a slurry over a substrate, said slurry containing a plurality of shaped blocks which are deposited onto recessed regions of the substrate; and pressing said plurality of shaped blocks into the substrate.

2. The method as in claim 1 wherein said substrate is flexible.

3. The method as in claim 1 wherein said substrate is rigid.

4. The method as in claim 1 wherein the substrate is heated.

5. The method as in claim 1 wherein a roller is used to press the plurality of blocks into the recessed regions of the substrate.

6. The method as in claim 5 wherein nonstick material is placed between the roller and the substrate.

7. The method as in claim 6 wherein the nonstick material is selected from the group consisting of polyethylene, polyester, tetrafluoroethylene, polytetrafluoroethylene, perfluorinated ethylenepropylene, polyfluoroethylene, copolymer of tetrafluoroethylene with (perfluoro)alkyl-vinyl ether, perfluoroalkoxyl, perfluoroalkoxy polymer, perfluoroalkylvinyl ether, copolymer, perfluorovinylalkylethertetrafluoroethylene copolymer, perfluoroalkoxyethylene, co-polytetrafluoroethylene-perfluoroalkoxy, FEP, PTFE, and PVDF.

8. The method as in claim 1 wherein the assembly has at least one organic light emitting diode.

9. A method of pressing shaped blocks into recessed regions in a substrate, said method comprising:

moving a substrate through at least one web process apparatus;

dispensing a slurry containing a plurality of shaped blocks onto said flexible substrate, said shaped blocks being deposited onto recessed regions of said substrate; and pressing said plurality of shaped blocks into said substrate.

10. The method as in claim 9 wherein said substrate moves at a rate of 5 inches per minute to 100 inches per minute.

11. The method in claim 9 wherein a display tape moves at a rate of 5 inches per minute to 100 inches per minute.

12. The method as in claim 9 wherein the substrate is rolled at the rate of 5 inches per minute to 100 inches per minute.

13. The method as in claim 11 wherein the display tape comprises a material selected from the group of polyether sulfone, polyethylene terephthalate, polycarbonate, polybutylene terephthalate, polyphenylene sulfide, polypropylene, polyester, aramid, nylon, polyamide-imide, polyimide, aromatic polyimides, polyetherimide, metallic materials, acrylonitrile butadiene styrene, and polyvinyl chloride.

* * * * *

UNITED STATES PATENT AND TRADEMARK OFFICE
CERTIFICATE OF CORRECTION

PATENT NO.    : 6,281,038 B1                                                Page 1 of 1
DATED         : August 8, 2001
INVENTOR(S)   : Jeffrey J. Jacobson et al.

It is certified that error appears in the above-identified patent and that said Letters Patent is hereby corrected as shown below:

<u>Column 1</u>,
After the title, please add the following paragraph:

-- <u>GOVERNMENT RIGHTS NOTICE</u>

This invention was made with government support with at least one of these contracts: Grant (Contract) Nos. AFOSR 91-0327; F49620-92-J-059-1; F33615-96-C-5111 with USAF/AFMC/ASC; DAA016-00-C-9234 USAMCAC (US Army); Northrop Grumman PO #8200014995 (subcontract, NOOO14-99-C-0395 (prime)); North Dakota State University Subcontract #4080, DMEA 90-01-C-0009 (prime) and University of Alaska, Fairbanks PO#FP201509 (subcontract), DMEA 90-01-C-0009 (prime). The Government has certain rights to this invention. --

Signed and Sealed this

Ninth Day of July, 2002

Attest:

Attesting Officer

JAMES E. ROGAN
Director of the United States Patent and Trademark Office